United States Patent
Liu

(10) Patent No.: US 8,570,791 B2
(45) Date of Patent: Oct. 29, 2013

(54) CIRCUIT AND METHOD OF WORD LINE SUPPRESSION

(75) Inventor: Jack Liu, Taipei (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 153 days.

(21) Appl. No.: 13/253,110

(22) Filed: Oct. 5, 2011

(65) Prior Publication Data

US 2013/0088913 A1  Apr. 11, 2013

(51) Int. Cl.
  *G11C 11/00* (2006.01)

(52) U.S. Cl.
  USPC ............ 365/156; 365/185.23; 365/49.1; 365/49.11; 365/154; 365/188; 365/189.011; 365/189.14; 365/189.15; 365/189.16; 365/230.01; 365/230.06; 365/203; 365/194

(58) Field of Classification Search
  USPC ............. 365/185.23, 49.1, 49.11, 154, 188, 365/189.01, 189.14, 189.15, 189.16, 365/230.01, 230.06, 156, 203, 194
  See application file for complete search history.

(56) References Cited

U.S. PATENT DOCUMENTS

| 7,505,345 | B2 | 3/2009 | Wang et al. |
| 7,969,191 | B2* | 6/2011 | Nedalgi ........................... 326/81 |
| 2011/0085390 | A1* | 4/2011 | Arsovski et al. ......... 365/189.11 |
| 2011/0194362 | A1* | 8/2011 | Lu et al. .................. 365/189.11 |

OTHER PUBLICATIONS

Pilo, H. et al., "A 64Mb SRAM in 32nm High-k Metal-Gate SOI Technology with 0.7V Operation Enabled by Stability, Write-Ability and Read-Ability Enhancements", IEEE International Solid-State Circuits Conference, 2011, Session 14, High-Performance Embedded Memory/14.1, pp. 254-256.

Khellah, M. et al., "Read and Write Circuit Assist Techniques for Improving Vccmin of Dense 6T SRAM Cell", IEEE International Conference on Integrated Circuit Design and Technology and Tutorial, Jun. 2008, pp. 185-188.

* cited by examiner

*Primary Examiner* — Fernando Hidalgo
(74) *Attorney, Agent, or Firm* — Duane Morris LLP

(57) ABSTRACT

A word line driver circuit for providing a suppressed word line voltage includes a switch configured to selectively load a word line to a suppressed word line voltage node and a word line charging circuit coupled between a high power supply node and the suppressed word line voltage node. The word line charging circuit includes a first transistor device responsive to a control pulse for charging the suppressed word line voltage node to a suppressed word line voltage and a second transistor device for maintaining the suppressed word line voltage.

20 Claims, 5 Drawing Sheets

CIRCUIT AND METHOD OF WORD LINE SUPPRESSION

TECHNICAL FIELD

This disclosure relates to circuits and methods for generation of suppressed word line voltages.

BACKGROUND

Static random access memory (SRAM) is a type of volatile semiconductor memory that stores data bits using bistable circuitry that does not need refreshing. An SRAM cell may be referred to as a bit cell because it stores one bit of information, represented by the logic state of two cross coupled inverters. Memory arrays include multiple bit cells arranged in rows and columns. Each bit cell in a memory array typically includes connections to a power supply voltage and to a reference voltage. Logic signals on bit lines control reading from and writing to a bit cell, with a word line controlling connections of the bit lines to the inverters, which otherwise float. A word line may be coupled to the bit cells in a row of a memory array, with different word lines provided for different rows.

A bit cell in an SRAM configuration known as six-transistor (6T) includes a pair of access transistors PG1 and PG2 switched by a signal on a word line WL and providing access to a pair of cross-coupled inverters, specifically by coupling signals on bit lines to complementary nodes of the cross-coupled inverters during read and write operations. "PG" in PG1 and PG2 may stand for "passing gate" because those transistors pass signals on the bit lines to the nodes of the cross coupled inverters when the word line signal at the gate terminal of transistors PG1 and PG2 becomes true (typically logical high on the gates of NMOS FETs). During standby mode, word line WL is not asserted (logical low), and the access transistors PG1 and PG2 disconnect the bit cell from the bit lines. The cross-coupled inverters are coupled to the power supply and reinforce each other to maintain one of two possible logic states with a stored data bit represented by the voltage at one of the nodes of the inverters and the complement of that bit at another node of the inverters. It is an understood convention that while complementary data values are stored at each of these nodes, the bit stored at one of the nodes is referred to as the bit value stored at the bit cell.

For a read operation, both bit lines of a bit cell are precharged high, and the word line WL is asserted. The stored data bit at one of the nodes (the node that stores the data bit of the bit cell, per the above-mentioned convention) is transferred to one of the bit lines BL, and the data bit at the other node is transferred to the other bit line BLB (which stands for "bit line bar", or bit line complement). A sense amplifier discerns which of BL and BLB is higher and which is lower, thereby determining the logic value stored in the bit cell. For a write operation, the value to be written is provided at BL, and the complement of that value is provided at BLB, when the word line WL is asserted.

During a read operation (read cycle), the correct (intended) functionality is that the data at the storage nodes in a bit cell remains unchanged while being read. But in some instances the storage nodes may undesirably interchange (swap) logic values, causing the bit cell to flip from one logic state to the other. Such an undesirable occurrence may be referred to as a "read flip" and may be due to various factors, e.g., storage device mismatch (e.g., imbalance in the strengths of transistors that form the bit cell) or a large amount of charge rushing into a storage node when a word line is asserted, thereby overwhelming the device. Read flips introduce errors in the data stored in the SRAM.

A known approach for addressing the issue of read flips is to reduce the constant level at which the word line is asserted. This approach is referred to as "under-drive" because the word line is driven at a lower level than when it is normally driven (i.e., WL is driven at a voltage level less than its normal level). For example, if the word line is ordinarily driven at a constant voltage of 5 V throughout a read or write cycle, the under-drive scenario may involve driving the word line at a constant level of 4 V (or some other constant fraction of 5 V) throughout the cycle.

The power supply voltage to the bit cell is also pertinent. The lowest VDD voltage (positive power supply voltage) at which an SRAM bit cell may function is referred to as Vccmin. Having a low cell VDD near Vccmin reduces leakage current and also reduces the incidence of read flips. Having a high cell VDD improves the probability of successful write operations. By choosing a voltage for the constant WL under-drive level, one may seek a balance (tradeoff) between the read Vccmin and the write Vccmin.

BRIEF DESCRIPTION OF THE DRAWINGS

The following will be apparent from elements of the figures, which are provided for illustrative purposes and are not necessarily to scale.

DETAILED DESCRIPTION

This description of the exemplary embodiments is intended to be read in connection with the accompanying drawings, which are to be considered part of the entire written description. In the description, terms concerning coupling and the like, such as "coupled", "connected" and "interconnected," refer to a relationship wherein structures communicate with one another either directly or indirectly through intervening structures unless expressly described otherwise.

Figure 1:
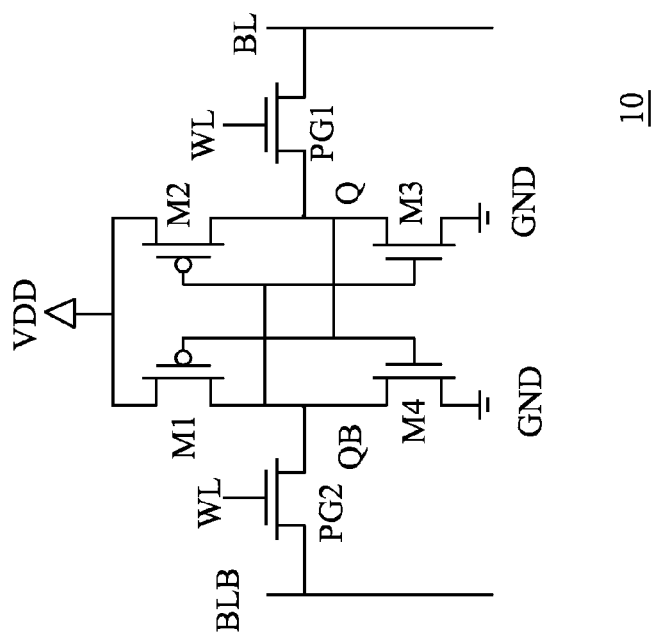
FIG. 1 is a schematic diagram of a static random access memory (SRAM) bit cell in a six-transistor (6T) configuration.

FIG. 1 is a schematic diagram of a static random access memory (SRAM) bit cell 100 in a six-transistor (6T) configuration. The present disclosure is applicable for this and other configurations to improve on deficiencies of prior art techniques and to improve read assist mechanisms for bit cell 100. Bit cell 100 includes a pair of cross-coupled CMOS inverters formed by transistors M1, M2, M3, and M4 as shown in FIG. 1. Passing gate (access) transistors PG1 and PG2 selectively couple storage nodes Q and QB to a bit line BL and a complementary bit line BLB, respectively, as shown. Transistors PG1 and PG2 are driven (controlled) by a word line WL coupled to the gates of transistors PG1, PG2. The value (data bit) stored at node Q may be the logic value stored by bit cell 100.

There are various techniques for implementing a suppressed word line WL voltage to improve read VCCmin. These techniques typically suffer from large DC current consumption and/or slow WL rise timing. Regulated power sources may also be used but consume large amounts of power and area. There is a need for an improved suppressed word line technique. In embodiments of the new technique described herein, a time controlled charge is used to charge the word line to an initial level. Thereafter, a low power consumption device is used to keep the suppressed word line level. This approach offers fast rise times with little area penalty and no DC power consumption.

Figure 2:
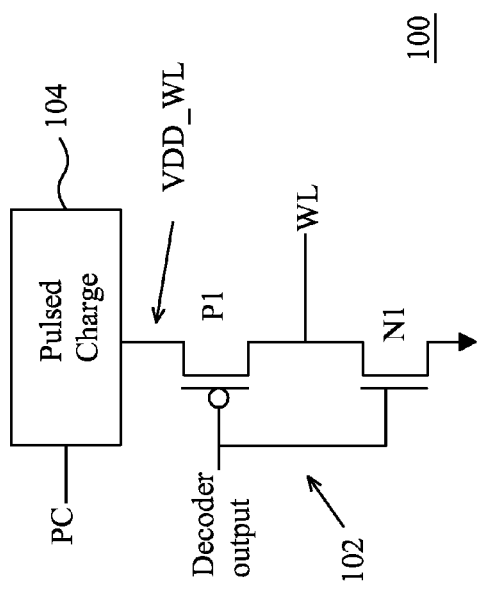
FIG. 2 is a schematic illustration of a circuit for providing a suppressed word line voltage.

FIG. 2 schematically illustrates an embodiment of a word line driver circuit 100 for providing a suppressed word line voltage for use with, for example, a SRAM cell described above in connection with FIG. 1. The word line driver circuit 100 includes a switch for connecting the word line to a power supply under control of a decoder output. In the illustrated embodiment, the switch takes the form of a CMOS inverter 102 including PMOS transistor P1 stacked with NMOS transistor N1. The gate terminals of N1 and P1 are coupled together to a control signal, such as the output of decoder. The drain terminals of the transistors are coupled together to a word line WL. The circuit 100 also includes a pulsed charge device 104 that charges VDD_WL for a short duration of time, responsive to pulsed control signal PC. The duration is determined by how fast the word line node can reach the proper suppressed WL voltage. In embodiments, the pulse width of control signal PC is controlled to be just long enough to charge WL to this target voltage. Once the desired WL voltage level is reached, the pulsed charge device 104 will operate to maintain VDD_WL at or near (i.e., substantially at) the desired voltage level.

Figure 2A:
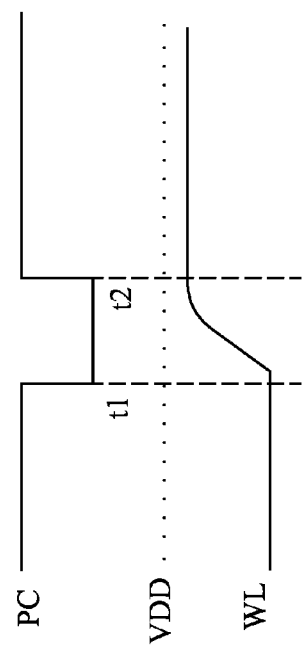
FIG. 2A is a timing diagram illustrating the operation of the circuit of FIG. 2.

This operation is illustrated in the timing diagram of FIG. 2A. When PC goes low, the word line begins to charge and the WL voltage rises. The pulse goes high when the WL voltage reaches a target level that is below VDD. Thereafter, the WL voltage is maintained at that level. Embodiments of circuits for implementing this operation are described below in connection with FIGS. 3A and 3B.

Figure 3B:
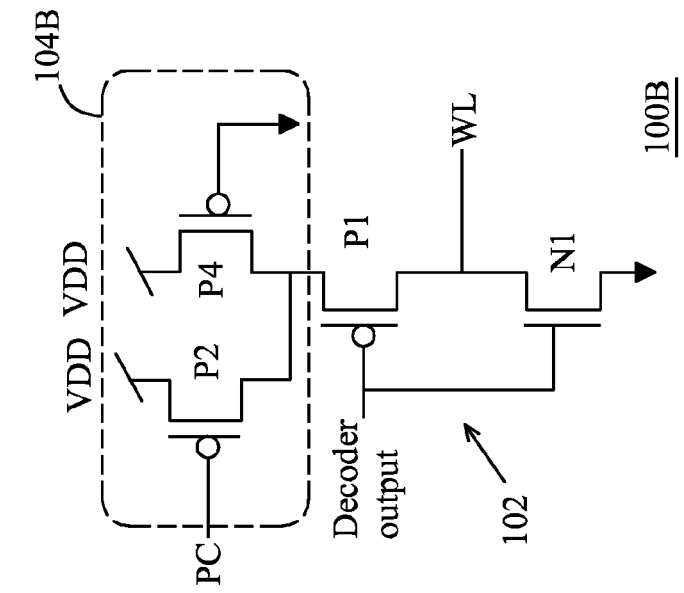
FIGS. 3A and 3B illustrate embodiments of the circuit of FIG. 2.
Figure 3A:
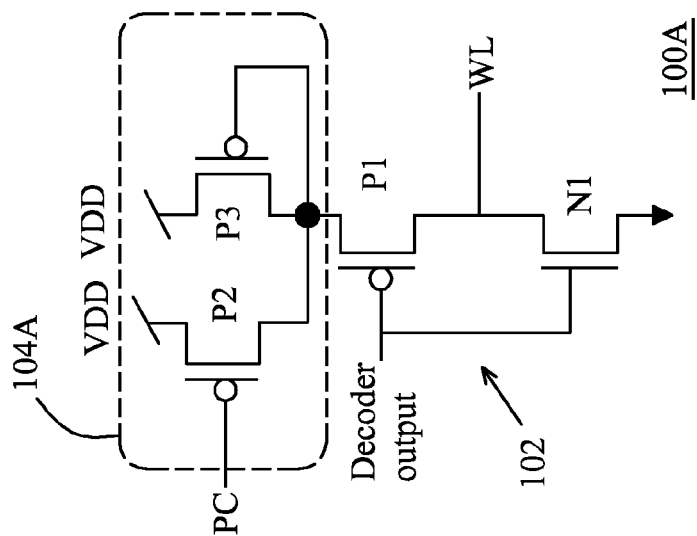

FIG. 3A illustrates an embodiment of a circuit 100A for providing a suppressed word line voltage. In this embodiment, the pulsed charge device 104A includes PMOSs P2 and P3 coupled between the high supply VDD rail and the source terminal of PMOS P1. Transistor P2 is controlled at its gate terminal by pulse control signal PC. Transistors P3 is diode connected with its gate terminal tied to its drain terminal. Transistor P2 is sized to have a strong drive capability so that the word line voltage can have a fast response time.

During operation, the decode signal at the gate terminal of transistor P1 turns transistor P1 on, connecting the word line WL to the pulsed charge circuit 104A. Control signal PC is originally high but then turns low at time t1 (see FIG. 2A). This turns on transistor P1, which begins to drive the word line voltage toward VDD. The pulse width of PC is set such that at time t2 PC goes high, turning off transistor P2 before the word line voltage WL reaches VDD. This leaves always on, diode-connected transistor P3 to maintain the word line voltage WL at the suppressed level. Because transistor P3 is diode connected, there is a voltage drop from its source terminal to its drain terminal, which keeps the word line voltage at or around the suppressed voltage level.

FIG. 3B illustrates another embodiment of a circuit 100B for providing a suppressed word line voltage. In this embodiment, the pulsed charge device 104B includes PMOSs P2 and P4 coupled between the high supply VDD rail and the source terminal of PMOS P1. Transistor P2 is identical to transistor P2 in FIG. 3A and is controlled at its gate terminal by pulse control signal PC. Transistors P4 is sized to be a relatively weak transistor, at least when compared to the drive capabilities of transistor P2, which is sized to have a strong drive capability so that the word line voltage can have a fast response time. Transistor P4 is always on (i.e., its gate terminal is tied to ground or other low voltage) but does not have sufficient drive capability to pull the word line voltage WL up to VDD after transistor P2 is turned off at time t2. In practice, the pulsed charge circuit 104B may be shared by a large number of word line drivers. The leakage current from this weak transistor device P4 ensures a voltage drop between the VDD node and the drain terminal of PMOS P4, keeping the word line voltage at a suppressed level.

Figure 4:
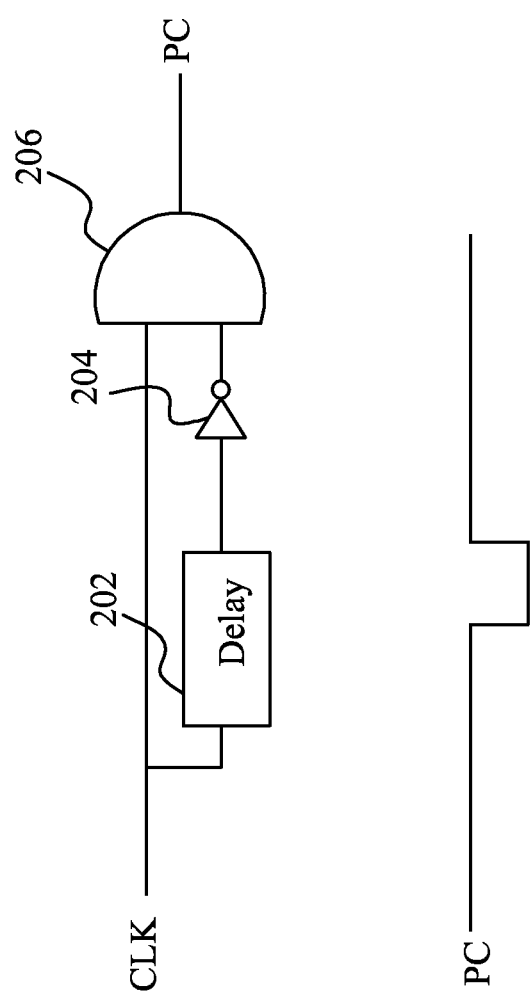
FIG. 4 illustrates a circuit for providing a pulsed control signal.

FIG. 4 illustrates an embodiment of a circuit 200 for providing pulsed control signal PC from a input clock signal CLK. The circuit 200 includes an AND logic gate having a first input coupled to the clock signal CLK. The circuit 200 also includes a delay element 202 having and input coupled to the clock signal CLK and an inverter 204 coupled to the output of the delay element 202. The output of the inverter 204 is coupled to a second input of the AND gate 206. The pulsed control signal PC is provided by the AND gate 206. The length of the pulse is roughly equal to the amount of delay induced by the delay element 202, which is easily controlled. The delay element 202 can take on any number of designs. In one simple design, the delay element 202 is a string of inverters.

Figure 5:
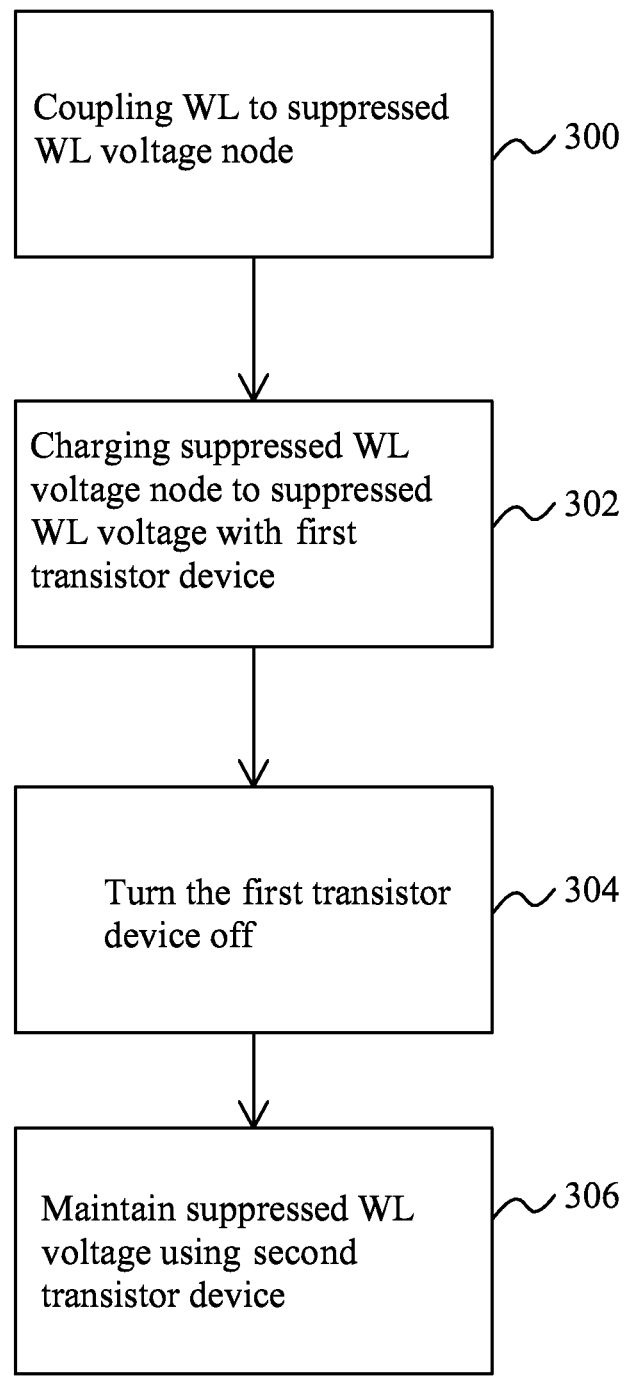
FIG. 5 illustrates one embodiment of a method of generating a suppressed word line voltage.

FIG. 5 illustrates one embodiment of a method of generating a suppressed word line voltage. At step 300, a word line is coupled to a suppressed word line voltage node. At step 302, the suppressed word line voltage node is charged to a suppressed word line voltage with a first transistor device. At step 304, the first transistor device is turned off after the word line voltage node reaches the suppressed word line voltage. Finally, at step 306, the suppressed word line voltage node is maintained at the suppressed word line voltage after turning the first transistor device off using a second transistor device In one embodiment of a word line driver circuit for providing a suppressed word line voltage, the driver circuit includes a switch configured to selectively load a word line to a suppressed word line voltage node and a word line charging circuit coupled between a high power supply node and the suppressed word line voltage node. The word line charging circuit includes a first transistor device responsive to a control pulse for charging the suppressed word line voltage node to a suppressed word line voltage and a second transistor device for maintaining the suppressed word line voltage.

In an embodiment of a static random access memory (SRAM), the SRAM includes a first bit cell of a static random access memory (SRAM) including cross coupled inverters configured for storing and retrieving a logic state, a word line coupled to the first bit cell, wherein the first bit cell is accessible via bit line connections through a passing gate transistor of the first bit cell controlled by the word line, and a word line driver circuit configured to provide a word line signal at the word line to drive the first bit cell during a memory access cycle. The word line driver circuit includes a switch configured to selectively load the word line to a suppressed word line voltage node, and a word line charging circuit coupled between a high power supply node and the suppressed word line voltage node. The word line charging circuit includes a first transistor device responsive to a control pulse for charging the suppressed word line voltage node to a suppressed word line voltage and a second transistor device for maintaining the suppressed word line voltage.

Although examples are illustrated and described herein, embodiments are nevertheless not limited to the details shown, since various modifications and structural changes may be made therein by those of ordinary skill within the scope and range of equivalents of the claims.

What is claimed is:

1. A word line driver circuit for providing a suppressed word line voltage comprising:
   a switch configured to selectively couple a word line to a suppressed word line voltage node; and
   a word line charging circuit coupled between a high power supply node and the suppressed word line voltage node, the word line charging circuit comprising a first transistor device responsive to a control pulse for charging the suppressed word line voltage node to a suppressed word line voltage and a second transistor device for maintaining the suppressed word line voltage.

2. The word line driver circuit of claim 1, wherein the switch comprises a CMOS inverter coupled between the suppressed word line voltage node and a ground node.

3. The word line driver circuit of claim 1, wherein the control pulse has a pulse length such that the first transistor device is turned off before the suppressed word line voltage node reaches a voltage of the high power supply node.

4. The word line driver circuit of claim 3, further comprising a control pulse generation circuit, the control pulse generation circuit including a delay element for providing a delay corresponding to the pulse length of the control pulse.

5. The word line driver circuit of claim 1, wherein the first transistor device is a PMOS transistor having a source terminal coupled to the high power supply node, a drain terminal coupled to the suppressed word line voltage node and a gate terminal to which the control pulse is coupled.

6. The word line driver circuit of claim 5, wherein the second transistor device is a diode connected PMOS transistor.

7. The word line driver circuit of claim 6, wherein the diode connected PMOS transistor has a source terminal coupled to the high power supply node and drain and gate terminals coupled to the suppressed word line voltage node.

8. The word line driver circuit of claim 5, wherein the second transistor device is a PMOS transistor having a drive capability lower than a drive capability of the first transistor device.

9. The word line driver circuit of claim 8, wherein the second transistor device is smaller than the first transistor device.

10. A method of generating a suppressed word line voltage comprising the steps of:
    coupling a word line to a suppressed word line voltage node;
    charging the suppressed word line voltage node to a suppressed word line voltage with a first transistor device;
    after the word line voltage node reaches the suppressed word line voltage, turning the first transistor device off; and
    after turning the first transistor device off, maintaining the suppressed word line voltage node at the suppressed word line voltage, using a second transistor device.

11. The method of claim 10, further comprising the step of providing a control pulse for controlling the first transistor device.

12. The method of claim 11, wherein the control pulse has a pulse length such that the first transistor device is turned off before the suppressed word line voltage node reaches a voltage of a high power supply node to which the first transistor device is connected.

13. The method of claim 10, wherein the second transistor device is a diode connected PMOS transistor.

14. The method of claim 10, wherein the second transistor device has a drive capability lower than a drive capability of the first transistor device.

15. A static random access memory (SRAM) comprising:
    a first bit cell of a static random access memory (SRAM) including cross coupled inverters configured for storing and retrieving a logic state;
    a word line coupled to the first bit cell wherein the first bit cell is accessible via bit line connections through a passing gate transistor of the first bit cell controlled by the word line;
    a word line driver circuit configured to provide a word line signal at the word line to drive the first bit cell during a memory access cycle, the word line driver circuit comprising:
       a switch configured to selectively couple the word line to a suppressed word line voltage node; and
       a word line charging circuit coupled between a high power supply node and the suppressed word line voltage node, the word line charging circuit comprising a first transistor device responsive to a control, pulse for charging the suppressed word line voltage node to a suppressed word line voltage and a second transistor device for maintaining the suppressed word line voltage.

16. The SRAM of claim 15, wherein the control pulse has a pulse length such that the first transistor device is turned off before the suppressed word line voltage node reaches a voltage of the high power supply node.

17. The SRAM of claim 16, further comprising a control pulse generation circuit, the control pulse generation circuit including a delay element for providing a delay corresponding to the pulse length of the control pulse.

18. The SRAM of claim 16, wherein:
    the first transistor device is a PMOS transistor having a source terminal coupled to the high power supply node, a drain terminal coupled to the suppressed word line voltage node and to gate terminal to which the control pulse is coupled; and
    the second transistor device is a diode connected PMOS transistor having a source terminal coupled to the high power supply node and drain and gate terminals coupled to the suppressed word line voltage node.

19. The SRAM of claim 16, wherein:
    the first transistor device is a PMOS transistor having a source terminal coupled to the high power supply node, a drain terminal coupled to the suppressed word line voltage node and a gate terminal to which the control pulse is coupled; and
    wherein the second transistor device is a PMOS transistor having a drive capability lower than a drive capability of the first transistor device.

20. The SRAM of claim 15, wherein the switch comprises a CMOS inverter coupled between the suppressed word line voltage node and a ground node.

* * * * *

UNITED STATES PATENT AND TRADEMARK OFFICE
CERTIFICATE OF CORRECTION

| | | |
|---|---|---|
| PATENT NO. | : 8,570,791 B2 | Page 1 of 1 |
| APPLICATION NO. | : 13/253110 | |
| DATED | : October 29, 2013 | |
| INVENTOR(S) | : Jack Liu | |

It is certified that error appears in the above-identified patent and that said Letters Patent is hereby corrected as shown below:

In the Claims

Claim 18, Column 6, Line 44 delete "to" preceding "gate" and insert -- a --.

Signed and Sealed this
Twenty-third Day of December, 2014

Michelle K. Lee
*Deputy Director of the United States Patent and Trademark Office*